United States Patent [19]

Akiba et al.

[11] Patent Number: 4,592,014
[45] Date of Patent: May 27, 1986

[54] MAGNETIC BUBBLE MEMORY DEVICE

[75] Inventors: Yutaka Akiba, Fujisawa; Kazuo Hirota, Yokohama, both of Japan

[73] Assignee: Hitachi, Ltd., Tokyo, Japan

[21] Appl. No.: 638,578

[22] Filed: Aug. 7, 1984

[30] Foreign Application Priority Data

Aug. 22, 1983 [JP] Japan .................................. 58-152691

[51] Int. Cl.$^4$ ............................................. G11C 19/08
[52] U.S. Cl. .................................................. 365/1; 365/2
[58] Field of Search ........................................ 365/1, 2

[56] References Cited

U.S. PATENT DOCUMENTS 4,165,535  8/1979  Mortelmans et al. .................. 365/2
4,326,267  4/1982  Lazzari ................................. 365/1

FOREIGN PATENT DOCUMENTS 0082774  6/1983  European Pat. Off. ................. 365/1
0022874  6/1980  Japan ..................................... 365/2
0008981  1/1982  Japan ..................................... 365/2

Primary Examiner—James W. Moffitt
Attorney, Agent, or Firm—Antonelli, Terry & Wands

[57] ABSTRACT

A magnetic bubble memory device comprises a cassette and a body. The cassette has a bias magnetic field generator adapted to generate a bias magnetic field for sustaining magnetic bubbles within a bubble memory chip and is removed of coils adapted to generate a rotating magnetic field for propagation of the magnetic bubbles. The body has a rotating magnetic field generator. The cassette is mounted to or dismounted from the body. When the cassette is dismounted from the cassette, information stored in the chip is held by the bias magnetic field generator and when the cassette is mounted to the body, information is read from or written into the chip by the rotating magnetic field generator.

15 Claims, 26 Drawing Figures

MAGNETIC BUBBLE MEMORY DEVICE

The present invention relates to a magnetic bubble memory device in which a bubble memory module is removably mounted to a main body of the device and more particularly to a magnetic bubble memory device suitable for employment of a thin and miniaturalized bubble memory module.

A magnetic bubble memory is known as a sort of memory. In the magnetic bubble memory, a cystalline plate of a suitable material (hereinafter referred to bubble memory chip) is provided and a bias magnetic field of proper intensity is applied across the memory chip so that magnetic bubbles may exist stably at given positions within the chip. To use the magnetic bubble memory by utilizing this nature thereof, magnetic bubbles are generated, and propagated to a predetermined site for their detection.

The magnetic bubble memory comprises a rotating field generator circuit adapted to generate a rotating magnetic field for the propagation of the magnetic bubbles. The rotating field generator circuit uses coils as a constituent. As well known in the art, a plurality of coils, for example, two coils are arranged such that magnetic fields to be generated by these coils are orthogonal to each other, and currents of $\pi/2$ phase difference are passed through the respective coils to produce a rotating field.

FIG. 1 illustrates, in a perspective view form, a bubble memory module 1 which packs a bias field generating means and rotating field generating coils, and a circuit board 3 carrying the bubble memory module 1. In FIG. 1, a bubble memory chip 11 incorporated in the bubble memory module 1 is depicted at dotted line and peripheral circuit elements 2 for driving and controlling the bubble memory module 1 are associated therewith.

The bubble memory module 1 of FIG. 1 has an internal structure as shown in FIG. 2 which is a sectional view taken on line II—II in FIG. 1. More particularly, the bubble memory chip 11 is mounted to a wiring substrate 12 formed of a glass epoxy plate, and orthogonal driving coils 13 and 14 adapted to generate a rotating field for the propagation of the magnetic bubbles within the bubble memory chip 11 surround the wiring substrate. A field homogenizer or magnetic shunt plate 15a and a magnet plate 16a are disposed above the driving coils 13 and 14, and a magnetic shunt plate 15b and a magnet plate 16b are disposed below the driving coils. A set of the upper magnetic shunt and magnet plates, a set of the lower magnetic shunt and magnet plates, and a shield case 18 are used to sustain the magnetic bubbles within the bubble memory chip 1. In order to fix the driving coils 13 and 14, magnetic shunt plates 15a and 15b and magnet plates 16a and 16b and to ensure damp-proof protection for the bubble memory module 1, all of these members are molded with resin 17. Further, the resin mold 17 is enclosed with the shield case 18 which shields the module from disturbance of external magnetic field.

In connection with the magnetic bubble memory device having the construction as above, a bubble memory cassette structure has been proposed, as disclosed in Japanese Patent Application Laid-Open No. 57-8981 laid open on Jan. 18, 1982, for example, to build the bubble memory module as a cassette.

However, the cassette according to the above proposal adheres to an old technique of module structure as shown in FIG. 2 wherein the coils 13 and 14 adapted to generate a rotating field for the propagation of the magnetic bubbles within the bubble memory chip 11 and the bias field generating means (15a, 15b, 16a, 16b, 18) are made to be a unitary structure and still has the following disadvantages.

(1) The thickness t of either driving coil 13 or 14 considerably increases the height H of the bubble memory module 1, thus increasing the cassette in size.

(2) To mitigate temperature condition imposed on the bubble memory chip 11, the amount of heat generated in the coils is reduced by decreasing DC resistance of the coils. This increases, however, the thickness t of the coils 13 and 14.

(3) The incorporation of the driving coils 13 and 14 in the bubble memory module 1 raises cost of the module per se since cost of the coil material and cost of working the coils are involved.

Accordingly, to further promote the widespread use of the bubble memory cassette, the advent of an inexpensive, miniaturized, thin and light bubble memory module is strongly desired.

The present invention intends to meet the above need and has for its object to provide an inexpensive magnetic bubble memory device which can be reduced in thickness, size and weight and which can mitigate the temperature condition.

According to this invention, a means adapted to generate a bias magnetic field for sustaining magnetic bubbles within a bubble memory chip is provided in a cassette while driving coils adapted to generate a rotating magnetic field for propagation of the magnetic bubbles are provided in a main body of a magnetic bubble memory device. The cassette is removably mounted to the body. When the cassette is dismounted from the body, information stored in the chip is sustained by the bias generating means. When mounted, information is read from or written in the chip by the rotating field generating means.

The present invention will be apparent from the following detailed description taken in conjunction with the accompanying drawings, in which.

The invention will now be described by way of example with reference to the accompanying drawings.

[FIRST EMBODIMENT]

Figure 1:
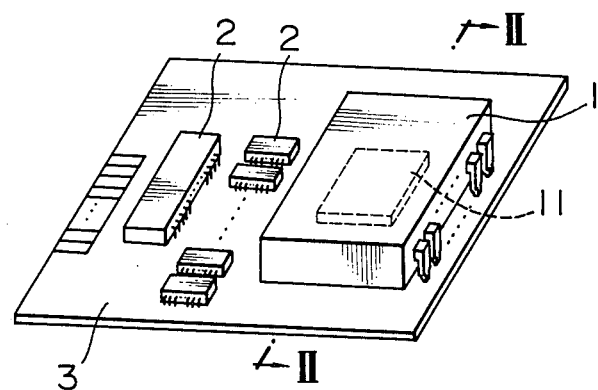
FIG. 1 is a perspective view showing a circuit board carrying a conventional bubble memory module.
Figure 2:
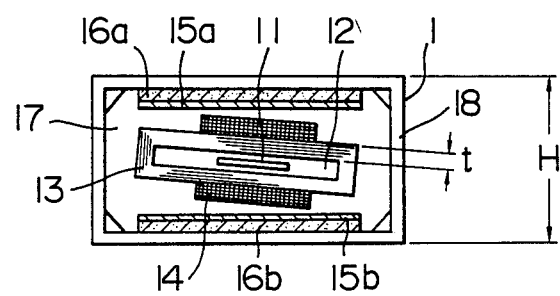
FIG. 2 is a sectional view taken on line II—II in FIG. 1.
Figure 3:
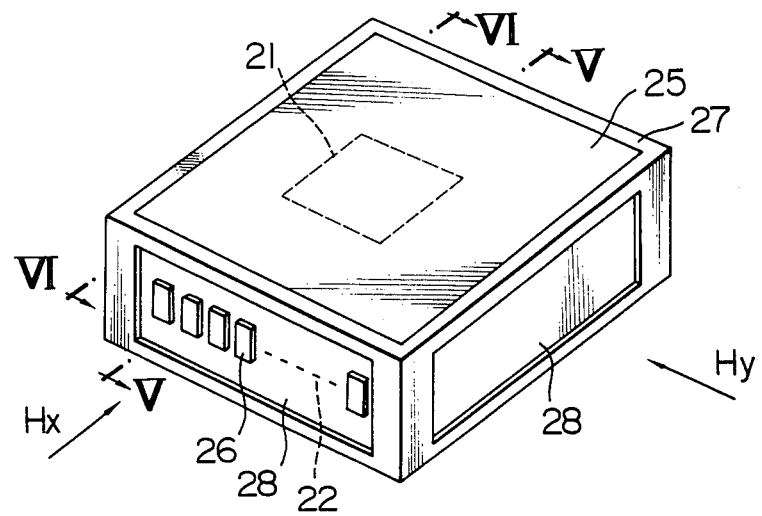
FIG. 3 is a perspective view of a cassette used in a device according to a first embodiment of the invention.
Figure 4:
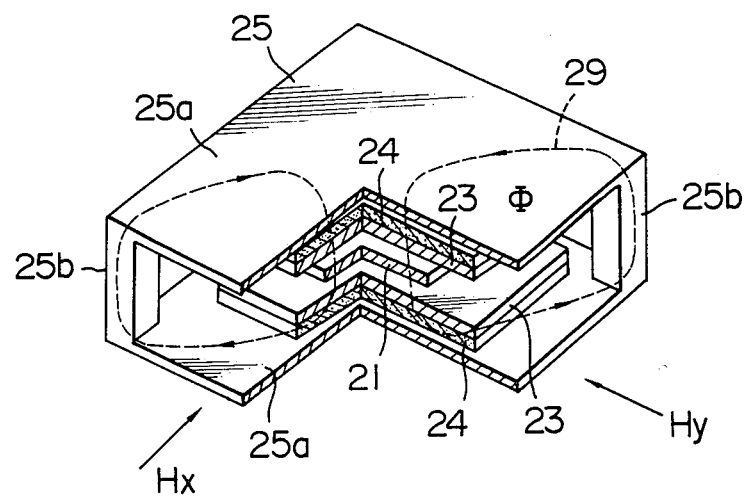
FIG. 4 is a perspective view, partly cut away, of the cassette shown in FIG. 3.

A bubble memory module hereinafter referred to as a cassette) according to a first embodiment of the invention is illustrated, in perspective view form, in FIG. 3. The FIG. 3 perspective view is partly exploded or cut away as shown in FIG. 4 to show a bias magnetic circuit in the cassette. The cassette of FIG. 3 is sectioned on line V—V and line VI—VI as shown in FIGS. 5 and 6, respectively.

Referring to FIG. 4, a set of upper magnetic shunt and magnet plates 23 and 24 are disposed above a bubble memory chip 21, and a set lower magnetic shunt and magnet plates also designated at 23 and 24 are disposed below the chip. A magnetic shield case 25 comprising upper and lower plates 25a and posts 25b surrounds the above members. The magnetic shield case 25 establishes closed magnetic paths for flux $\phi$ as shown at dotted curves 29 to provide a bias magnetic circuit. As will be clear from FIG. 4, the upper and lower plates 25a of the magnetic shield case 25 are connected together at four corners by means of the posts 25b, and four side surfaces of the cassette is uncovered or opened.

Figure 5:
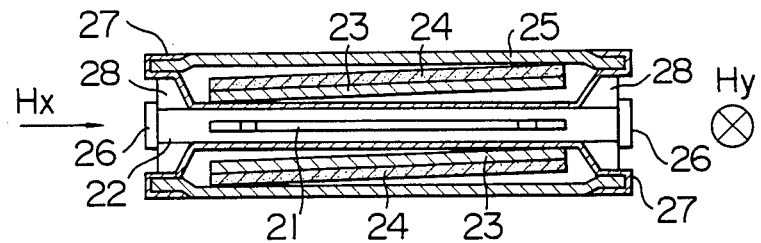
FIG. 5 is a sectional view taken on line V—V in FIG. 3.
Figure 6:
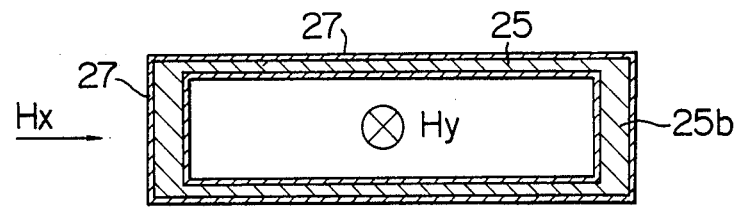
FIG. 6 is a sectional view taken on line VI—VI in FIG. 3.

Turning to FIG. 5, the bubble memory chip 21 carried by a wiring substrate 22 is electrically connected thereto and the substrate 22 has, at its opposite side ends, external connection terminals 26. To eliminate the influence of rotating field components Hx and Hy, as applied from the outside of the cassette, upon the bias magnetic circuit, upper and lower (electrically) conductive shield cases 27 enclose the magnetic shield case 25 excepting upper and lower surfaces thereof. The conductive shield cases 27 are disposed above and below the wiring substrate 22 with their central portions arranged in parallel therewith. Opposite side edge portions of each of the upper and lower conductive shield cases are bent to wrap opposite side portions of each of the upper and lower plates 25a of the magnetic shield case 25. Thus, the central portions of the upper and lower conductive shield cases 27 are kept in parallelism with the major surfaces of the bubble memory chip 21 to improve uniformity of the rotating field applied thereto. An end portion of the cassette cleared of the bubble memory chip 21 is sectioned as shown in FIG. 6. This illustration indicates that the magnetic shield case 25 inclusive of its posts 25b is enclosed with the conductive shield cases 27. A spacing between either side end of the substrate 22 and either side end of each of the conductive shield cases 27 is filled with a mold portion 28. In this manner, the respective magnet plates 24 serving as the bias field generating means are enclosed with the magnetic shield case 25 and the respective conductive shield cases 27. However, the four sides of the bubble memory chip 21 are uncovered from the shielding so that the rotating field components Hx and Hy as applied to these sides can pass through the chip.

With the above construction, the magnetic bubble memory cassette serving as storage medium can be dispersed with the rotating field generating means.

Being different from an illustration of FIG. 5, the entire magnetic shield case 25 inclusive of its upper and lower plates 25a may alternatively be enclosed with the conductive shield cases 27 at the cost of a slight increase in the height of the cassette.

Figure 7:
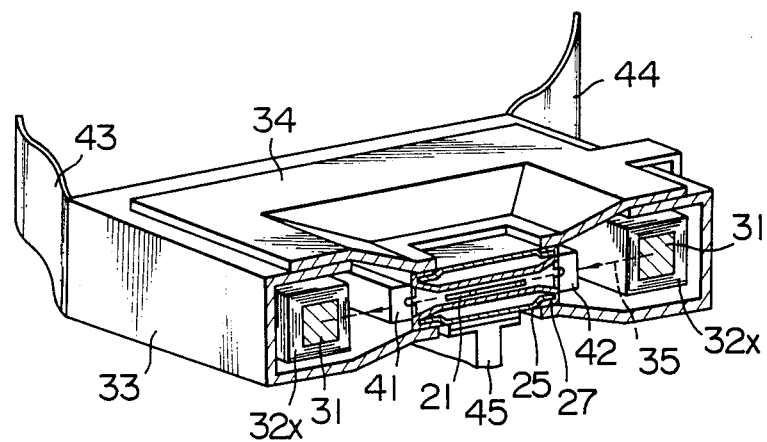
FIG. 7 is a perspective view, partly exploded, of the device according to the first embodiment of the invention.

The cassette of FIG. 3 is mounted into a rotating field generator disposed on a main body of magnetic bubble memory device as is shown in FIG. 7 which is a fragmentary sectional perspective view of the device. The rotating field generator, as disclosed in U.S. Pat. No. 4,165,535, for example, comprises a pair of X coil 32x and Y coil 32y wound on a core 31 in the form of a picture frame (hereinafter referred to as annular rectangular-parallelpiped core) to generate a rotating field. Conductive shield cases 33 and 34 surround the core 31 and coils 32x and 32y. It should be noted that the coil 32y disposed on the rear of the body is concealed by the conductive shield cases 33 and 34 and is not depicted in FIG. 7. The rotating field generator shown in FIG. 7 receives, at its central portion, the cassette shown in FIG. 3, and inner side edges of a central portion of each of the conductive shield cases 33 and 34 connect to side ends of the respective conductive shield cases 27 of the cassette so that the bubble memory chip 21 and a rotating field generating means (core 31 and coils 32x and 32y) can be placed in a single spacing defined by the shield cases 33 and 34. A rotating magnetic field as shown at dotted line 35 is so applied as to drive the bubble memory chip 21 and is shielded by means of the conductive shield cases 27, 33 and 34 so as not to be affected by the bias magnetic circuit. To avoid complexity of illustration, the bias magnetic circuit including the magnet plates 24 is not illustrated in FIGS. 7 to 9. For details of the bias magnetic circuit, reference should be made to FIG. 5.

When the cassette is mounted to the rotating field generator, the external connection terminals 26 of the cassette are connected to connectors 41 and 42 and led to external peripheral circuits via flexible wiring strips 43 and 44.

Figure 8:
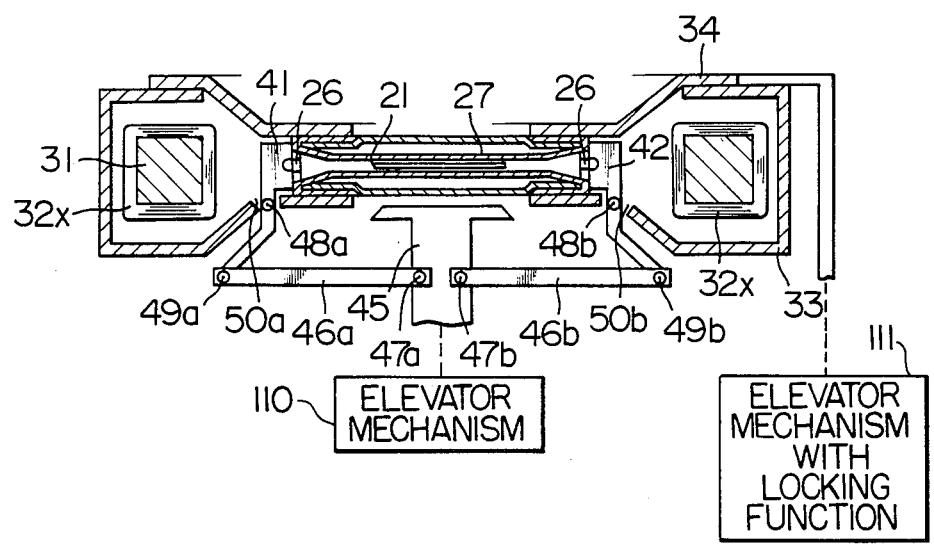
FIG. 8 is a front sectional view of the device shown in FIG. 7.
Figure 9:
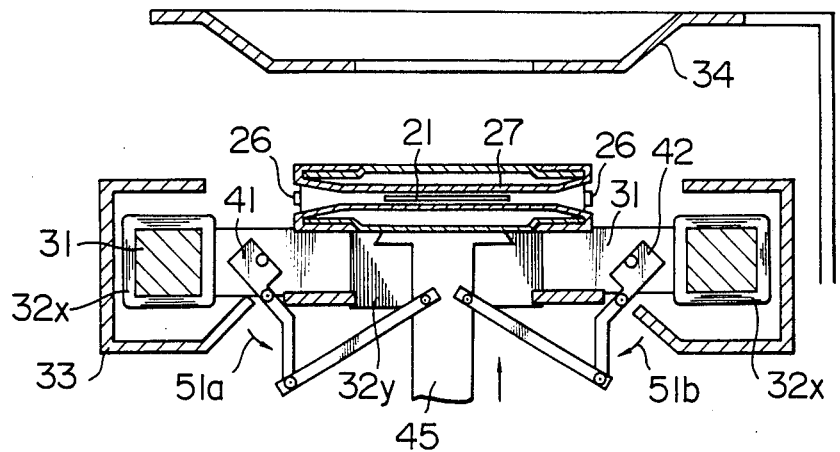
FIG. 9 is a front sectional view useful in explaining mounting and dismounting of the cassette.

The cassette is mounted to or dismounted from the rotating field generator by means of a mechanism as shown in FIGS. 8 and 9. The conductive shield case 34 is operable. When the cassette is mounted, the case 34 is closed as shown in FIG. 8 and when the cassette is being taken out of the body, the case 34 is opened.

A support 45 has its top surface engageable with the cassette and is moved vertically when mounting or dismounting the cassette. The support 45 is provided with arms 46a and 46b which are rotatable about shafts 47a and 47b. The connectors 41 and 42 are rotatable about stationary shafts 48a and 48b and have their lower ends rotatably coupled with the arms 46a and 46b through shafts 49a and 49b. The connectors 41 and 42 pass through holes 50a and 50b formed in the shield case 33 to extend to the arms 46a and 46b for mechanical connection therewith.

As the conductive shield case 34 is opened and the support 45 is moved upwards, the connectors 41 and 42 are turned in directions of arrows 51a and 51b so as to be released from the cassette and at the same time, the cassette is pushed upwards. The cassette can be mounted into the rotating field generator through a converse procedure.

Preferably, contacts of the connectors 41 and 42 to be in electrical connection with the external connection terminals 26 of the cassette and made of a resilient material such as conductive rubber to ensure good electrical connection when the magnetic bubble memory device shown in FIG. 8 is in operation. In other embodiments to be described later, it is preferable that resilient contacts be also used.

As illustrated in FIG. 8, an elevator mechanism 110 is auxiliarily arranged below the support 45 and an elevator mechanism 111 with a locking function is auxiliarily arranged right below the case 34.

As described above, according to the first embodiment of the present invention, the cassette removed of the rotating field generator can be obtained to realize miniaturization of the cassette. When this type of cassette is mounted in the rotating field generator disposed on the body of the device, information can be read from or written into the magnetic bubble memory.

[SECOND EMBODIMENT]

In the first embodiment described previously, the external connection terminals 26 are provided on the opposite sides of the cassette. Alternatively, external connection terminals may be provided on a top or bottom surface of the cassette. A second embodiment will be described wherein external connection terminals are provided on a bottom surface of a cassette.

Figure 10:
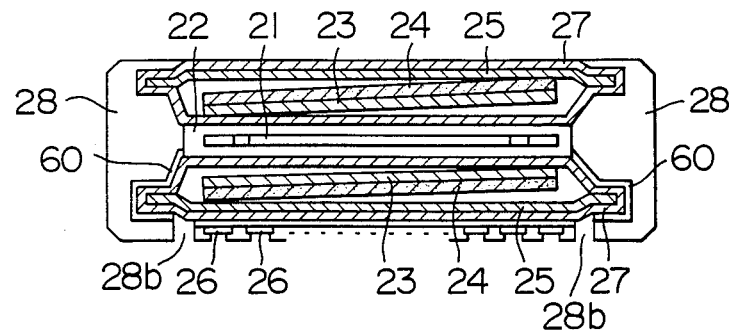
FIG. 10 is a sectional view of a cassette used in a device according to a second embodiment of the invention.
Figure 12:
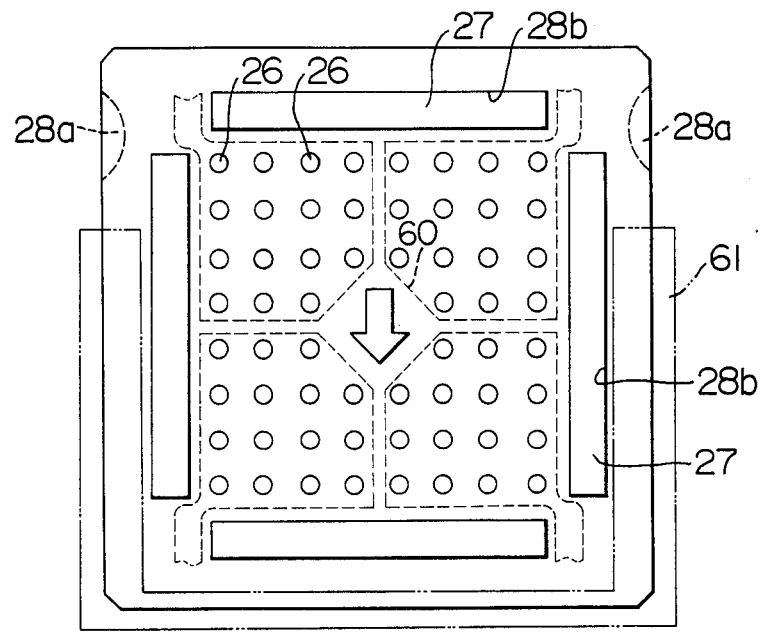
FIG. 12 is a bottom view of the cassette shown in FIG. 10.
Figure 13:
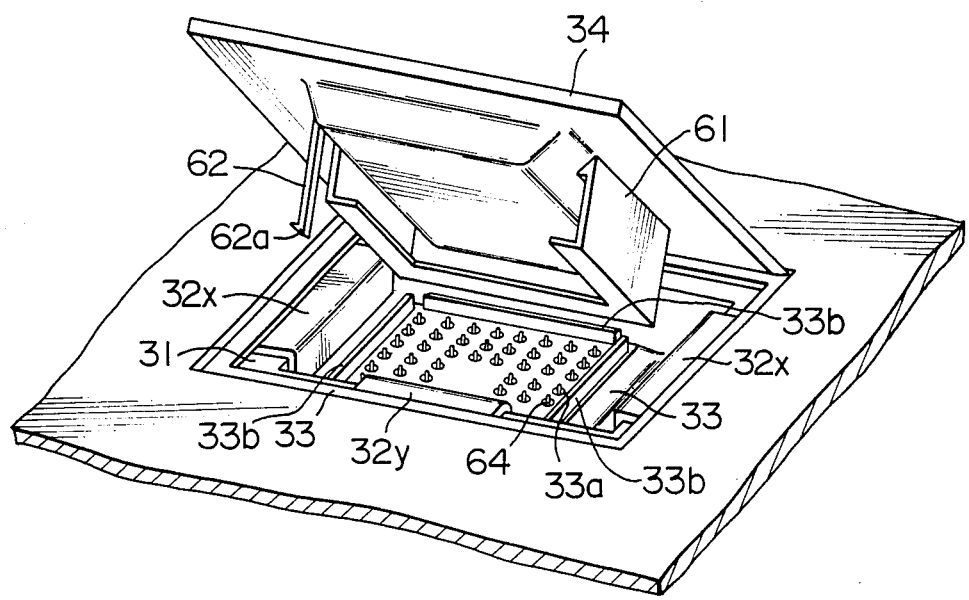
FIG. 13 is a fragmentary perspective view of a body of the device according to the second embodiment with the cassette dismounted.
Figure 14:
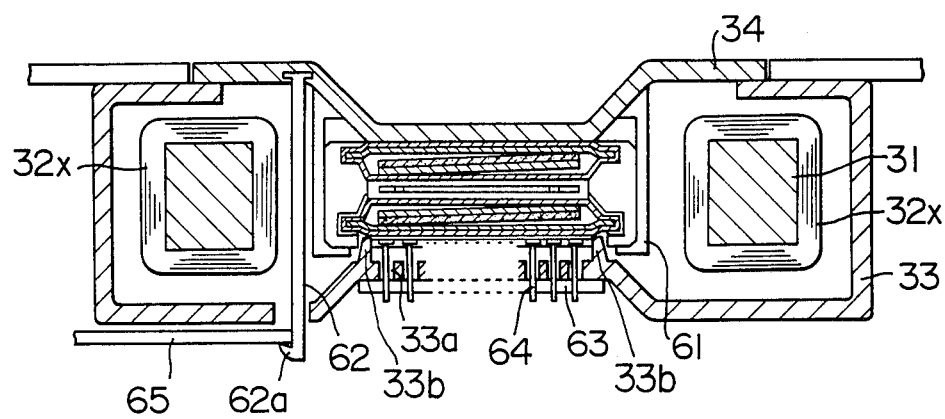
FIG. 14 is a fragmentary sectional view of the FIG. 13 body with the cassette mounted.

A cassette used in the second embodiment is sectioned as shown in FIG. 10. The cassette of FIG. 10 has an external connection terminal as shown in exaggerated sectional form in FIG. 11 and a bottom configuration as shown in FIG. 12. A body of a magnetic bubble memory device as shown in FIG. 13 receives this cassette. The cassette is mounted in the body as shown in FIG. 14.

The cassette of the second embodiment is specifically different from that of the first embodiment in that input/output terminals of a bubble memory chip 21 carried on a wiring substrate 22 are distributed to the bottom surface of the cassette through two flexible printed circuits 60. More particularly, the two flexible printed circuits 60 connected to right and left sides of the wiring substrate 22 extend along a conductive shield case 27 and the bottom surface of the cassette and individual conductors of the flexible printed circuits 60 are electrically connected to individual external connection terminals 26.

Figure 11:
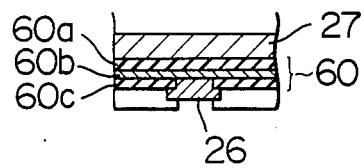
FIG. 11 shows an enlarged fragmentary section in FIG. 10.

The neighbourhood of one external connection terminal 26 is exaggeratedly sectioned in FIG. 11. As shown, the flexible printed circuit 60 has a triple layer structure wherein an intermediate conductor layer 60b is sandwiched by upper and lower insulating layers 60a and 60c. The lower insulating layer 60c is bored at a predetermined position to expose a portion of the conductor layer 60b to which a metal layer such as a solder acting as the external connection terminal 26 is electrically connected. Over the entire bottom surface of the cassette, the external connection terminals 26 are distributed two-dimensionally as shown in FIG. 12.

Similar or identical elements in the cassette of FIG. 10 to those in the cassette of FIG. 5 are designated by identical reference numerals. Particularly, in the FIG. 10 cassette, the entire bias magnetic circuit is enclosed with a conductive shield case 27 to ensure the application of a rotating field to the bubble memory chip 21.

As shown in FIG. 12, the periphery of the mold portion 28 is provided with rectangular apertures 28b through which a part of the conductive shield case 27 is exposed. The apertures 28b are formed for connection to a conductive shield case (33) of the body of the magnetic bubble memory device, as will be described later. Dotted lines 60 shown in a central portion of FIG. 12 illustrate an example of wiring in the flexible printed circuits 60 shown in FIG. 10. Four flexible printed circuits each having fifteen external connection terminals 26 are wired through gap portions between the apertures 28b.

The cassette of FIG. 10 is mounted into or dismounted from the body of magnetic bubble memory device as will be described below with reference to FIGS. 13 and 14 in which similar or identical elements to those in FIGS. 7 to 9 are designated by identical reference numerals.

In a perspective view of FIG. 13, there is shown a conductive shield case 34 of a body rendered opened, which case is pivotally mounted to the body and is normally biased by a spring means (not shown) in the opening direction. The conductive shield case 34 is secured with a cassette holder 61 and studded with a lock bar 62 having a locking tip 62a.

On the other hand, as shown in FIG. 14, the body has a rotating field generator comprising a rectangular solid core 31 and coils 32x and 32y, and a conductive shield case 33 which surrounds the rotating field generator. The conductive shield case 33 has, at its central portion, a plurality of holes 33a through which a plurality of connection members 64 studded in a substrate 63 pass so as to project into the interior of the shield case 33, as shown in FIG. 14. The connection members 64 serving like the connectors 41 and 42 in FIG. 8 are made of conductive rubber or formed of metallic spring pins and preferably, resiliently urged downwards as viewed in FIG. 14.

When mounting the cassette to the body of FIG. 13, the cassette is first inserted into the cassette holder 61 of the conductive shield case 34. In this procedure, the cassette is inserted in a direction of arrow shown in FIG. 12 with its external connection terminals 26 faced down. Thereafter, the conductive shield case 34 is closed so that the locking tip 62a of the lock bar 62 engages a lock member 65 of the body, thereby completing mounting of the cassette. Upon completion of mounting of the cassette, the plurality of external connection terminals 26 on the bottom surface of the cassette are respectively connected electrically to the plurality of connection members 64 of the body. Also, projections 33b provided on the bottom surface of the conductive shield case 33 connect to the conductive shield case 27 of the cassette through the apertures 38b. Further, the bottom peripheral edge of the conductive shield case 34 connects to the top peripheral edge of the conductive shield case 33 of the body. Under this condition, the magnetic bubble memory device is ready to operate.

In order to dismount the cassette after completion of operations, an eject button (not shown) of the body is pushed to move the lock member 65 shown in FIG. 14 to the left therein for disengagement from the lock bar 62. As a result, the conductive shield case 34 is opened as shown in FIG. 13 by biasing force of the spring means (not shown) to cause the cassette to be ready for removal. FIG. 12 illustrates recesses 28a formed in an upper portion of the cassette. These recesses, formed integrally with the mold portion 28, are accessed by fingers to facilitate removal of the cassette. The positional relationship between the cassette and cassette holder 61, though not illustrated in FIG. 13, may be exemplified as shown in FIG. 12 such that the recesses 28a are cleared of the cassette holder 61 when the cassette is mounted.

Since in the second embodiment the external connection terminals 26 can be distributed over substantially the entire area of the bottom surface of the cassette, this embodiment is very advantageous for providing the cassette with a multiplicity of terminals.

[THIRD EMBODIMENT]

The rotating field generator has been exemplified as having the annular rectangular-parallelepiped core 31 and coils 32x and 32y in the previous first and second embodiments. However, as far as technical idea of the present invention is concerned, the configuration of the rotating field generator is not a matter of significance. Thus, the rotating field generator will be explained hereinafter by way of rectangular solenoids.

Rectangular solenoid coils are disclosed in Japanese Patent Publication No. 55-22874 published on June 19, 1980 (U.S. Pat. No. 3,996,574), for example. According to a third embodiment of the present invention, a cassette with a bubble memory chip and a bias field generating means is mounted into or dismounted from this type of rectangular solenoid coils.

Figure 15:
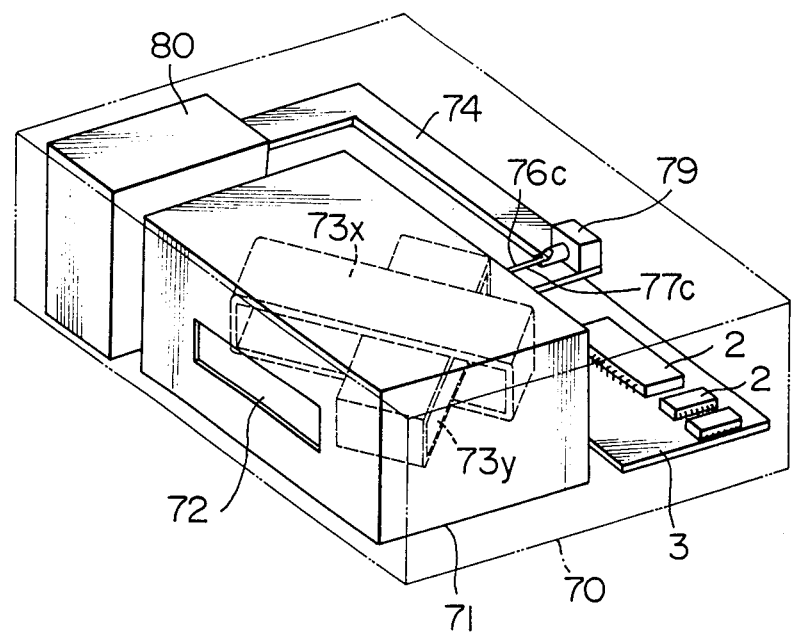
FIG. 15 is a perspective view of a body of a device according to a third embodiment of the invention with a cassette dismounted.
Figure 16:
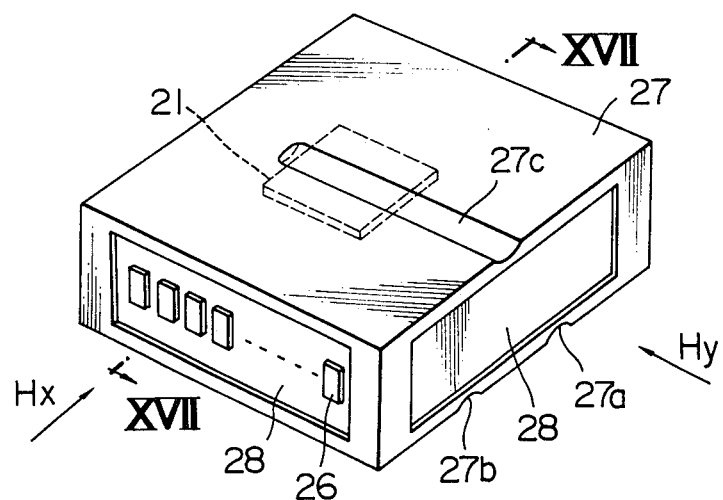
FIG. 16 is a perspective view of the cassette used in the third embodiment of the invention.
Figure 17:
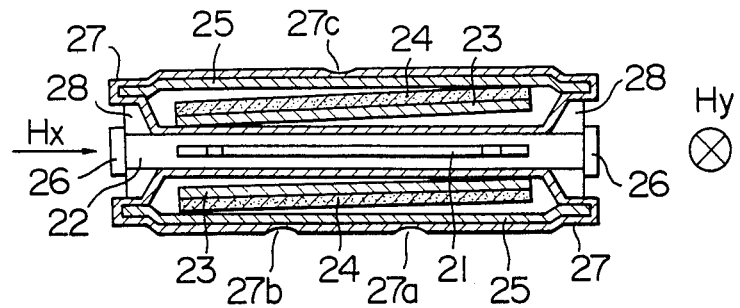
FIG. 17 is a sectional view taken on line XVII—XVII in FIG. 16.

A main body of a device and a cassette in accordance with the third embodiment of the invention are illustrated, in perspective view form, in FIGS. 15 and 16. The body, 70, has a rotating field generator 71 comprising a cassette inserting portion 72 and rectangular solenoid coils 73x and 73y. The cassette of this embodiment, similar to the cassette of the first embodiment shown in FIG. 5, is illustrated in sectional form in FIG. 17 by representing like elements at identical reference numerals which will not be described herein for avoiding prolixity of description. Specifically, the difference resides in that upper and lower bias magnetic circuits (24) are enclosed with upper and lower conductive shield cases 27 to ensure the application of a rotating magnetic field to a bubble memory chip 21, and that two insertion guide grooves 27a and 27b and one insertion guide groove 27c are formed in the lower and upper conductive shield cases 27, respectively.

Figure 18:
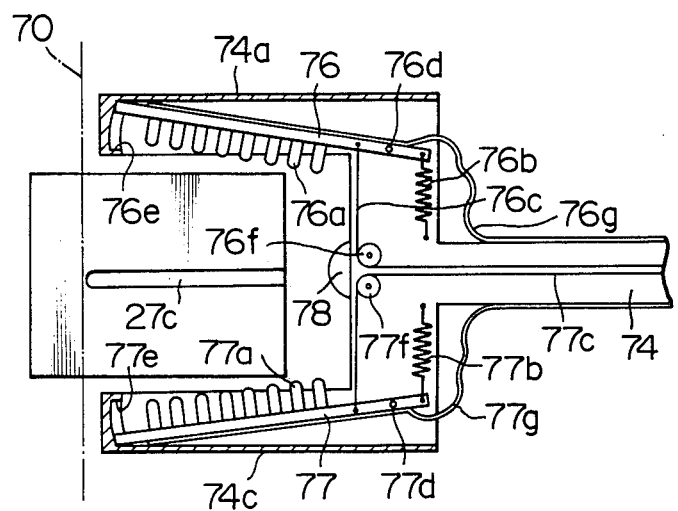
FIG. 18 is a fragmentary cross-sectional view of the body shown in FIG. 15.
Figure 19:
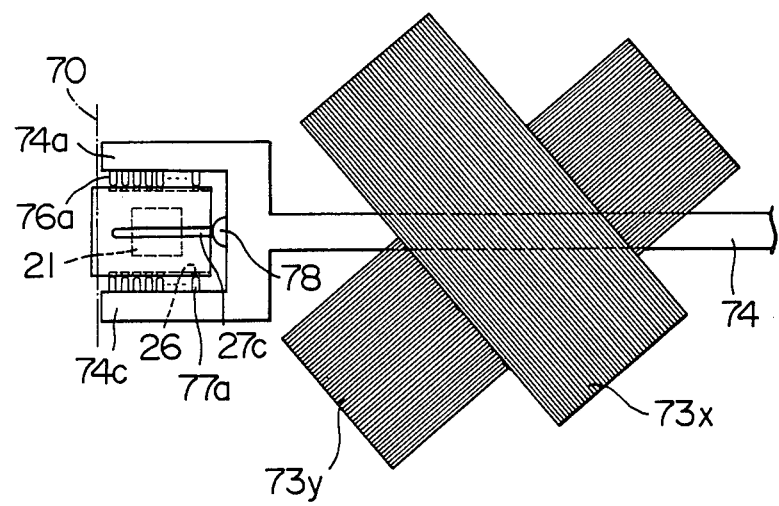
FIG. 19 is a fragmentary plan view of the FIG. 15 body.
Figure 20:
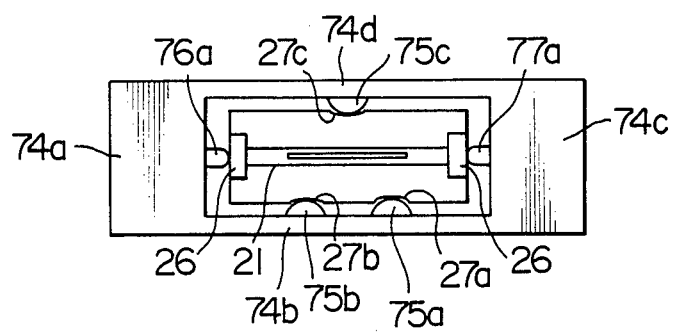
FIG. 20 is a lefthand side view of the body shown in FIG. 19.

The cassette is mounted to or dismounted from the body as will be described with reference to FIGS. 18 to 20. As shown in FIGS. 19 and 15, the coils 73x and 73y are put together such that a wide front spacing is established for passage of the cassette. A cassette moving member 74 extends to pass through the coils 73x and 73y. The moving member 74 is seen from front in FIG. 20, and a cross-sectional form on a central plane in FIG. 20 is illustrated in FIG. 19. At least a front portion of the moving member 74 is made of a material having no adverse effect upon the magnetic field. To facilitate reception of the cassette, the front cassette reception portion takes the form of a box including a lefthand portion 74a, a lower portion 74b, a righthand portion 74c and an upper portion 74d. The upper and lower portions 74d and 74b assist in positioning the cassette being inserted, and the lefthand and righthand portions 74a and 74c assist in connection to external connection terminals 26 of the cassette.

When mounting the cassette, the cassette is first inserted into the cassette inserting portion 72 shown in FIG. 15. The cassette is then advanced inwards while the three guide grooves 27a, 27b and 27c being respectively guided by resilient pins 75a and 75b on the lower portion 74b and a resilient pin 75c on the upper portion 74d. To allow the insertion of the cassette, connectors 76 and 77, having each a set of terminals 76a and a set of terminals 77a to be connected to the external connection terminals 26 on the opposite sides of the cassette, are urged to open during the insertion by biasing forces of springs 76b and 77b, respectively, as shown in FIG. 18. When the cassette has been inserted to the extremity, a foremost portion of the cassette pushes a switch 78 provided on the moving member 74 to turn on the same. With the switch 78 turned on, a plunger 79 (see FIG. 15) provided on the moving member 74 is actuated. Then, the plunger 79 tenses wires 76c and 77c connected to the connectors 76 and 77 to cause the connector 76 to turn counterclockwise about a shaft 76d acting as a fulcrum and the connector 77 to turn clockwise about a shaft 77d also acting as a fulcrum. As a result, the terminals 76a and 77b are brought into connection to the external connection terminls 26 on the opposite sides of the cassette, as shown in FIG. 19. Stoppers 76e and 77e (see FIG. 18) against the motion of the connectors 76 and 77 are formed integrally with the lefthand and righthand portions 74a and 74c, respectively. The wires 76c and 77c are applied over pulleys 76f and 77f, and the terminals 76a and 77a are connected to external circuits via flexible printed circuits 76g and 77g.

When the electrical connection of the connectors to the cassette has been completed in a manner described above, a driving unit 80 as shown in FIG. 15, comprised of a plunger, for example, is actuated to move the moving member 74 to the right in FIG. 19. The actuation of the driving unit may be responsive to a command originating from an external operation by the user or the driving unit may be actuated automatically following detection of the actuated plunger 79. As the moving member 74 moves, the cassette is conveyed to the center of the coils 73x and 73y, though the cassette being at the ultimate position is not illustrated, thereby placing the magnetic bubble memory device in condition for operation. Thus, the rotating field is applied to the bubble memory chip 21 and information is ready for writing or reading.

After completion of write or read of the information, the cassette is dismounted from the body as will be described below. When dismounting the cassette, the driving unit 80 is released by an operation button (not shown) to return the moving member 74 to the position shown in FIG. 19. To release the connectors 76 and 77 for bringing them to the position shown in FIG. 18, the return of the moving member 74 to the position in FIG. 19 is detected mechanically by a detector (not shown) to deenergize the plunger 79. Consequently, the connectors 76 and 77 are opened by tension of the springs 76b and 77b, thus allowing the cassette to be dismounted by hand. Preferably, the detector is so arranged as to deenergize the plunger 79 on the way of the return of the moving member 74 to the position in FIG. 19, to ensure that the cassette can be ejected over a slight distance under the application of inertia to the cassette in the course of the return of the moving member 74, thereby further facilitating removal of the cassette.

[FOURTH EMBODIMENT]

In the previous first, second and third embodiment, the entirety of the cassette with the bubble memory chip and bias field generator is mounted into the rotating field generator. In a fourth embodiment to be described below, a cassette comprises a bubble memory chip and a first bias field generating means, and a body of a device comprises a rotating field generator and a second bias field generating means, whereby the bubble memory chip or a wiring substrate carrying the same provided in the cassette is transferred to the body. The fourth embodiment will be described with reference to FIGS. 21 to 26.

Figure 21:
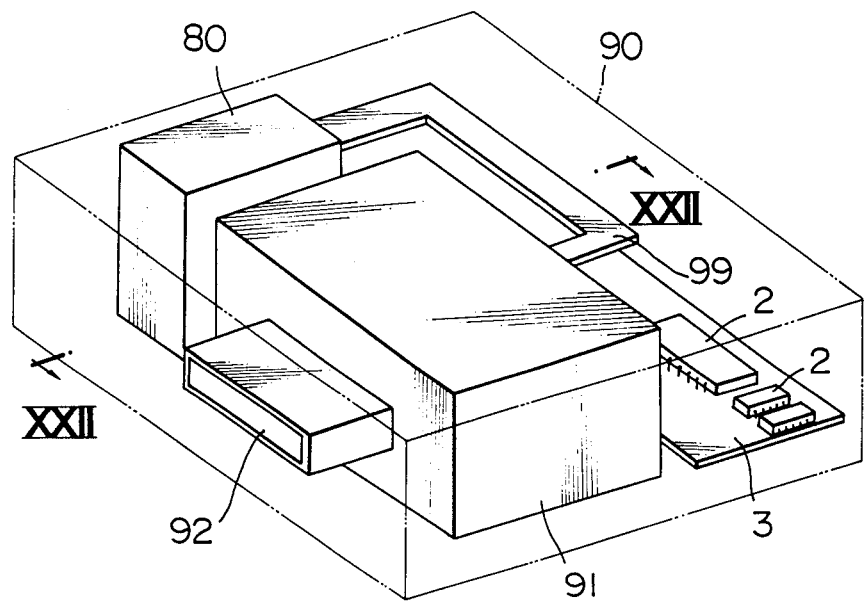
FIG. 21 is a perspective view of a body of a device according to a fourth embodiment of the invention with a cassette dismounted.
Figure 22:
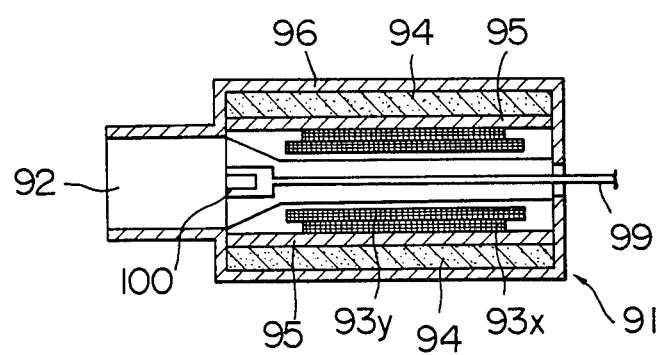
FIG. 22 is a sectional view taken on line XXII—XXII in FIG. 21.

As shown in perspective view form in FIG. 21, a body 90 comprises a rotating field generator 91 and a cassette inserting portion 92. Constitutional elements of the rotating field generator 91 are best shown in FIG. 22 in which the rotating field generator 91 and cassette inserting portion 92 depicted in FIG. 21 is sectioned on line XXII—XXII. Referring to FIG. 22, coils 93x and 93y, arranged orthogonally to each other, are important elements for the rotating field generator 91. This rotating field generator 91 further comprises a bias magnetic circuit including upper and lower magnet plates 94, upper and lower magnetic shunt plates 95 and a magnetic shield case 96.

Figure 23:
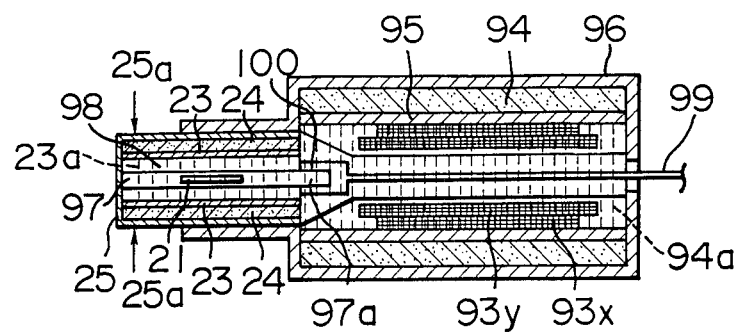
FIG. 23 is a sectional view useful in explaining mounting process of the cassette in the fourth embodiment of the invention.

On the other hand, a cassette comprises, as shown in FIG. 23, a bias field generating means including, as in the previous embodiments, upper and lower magnetic shunt plates 23 and upper and lower magnet plates 24, and the entire cassette is enclosed with a magnetic shield case 25. The cassette of FIG. 23 is specifically different from the cassette of the previous embodiments in that a wiring substrate 97 carrying a bubble memory chip 21 is integral with a package mold portion 98 molding the wiring substrate 97 to form a unitary structure which is separable from the cassette, and that external connection terminals 97a are provided on the righthand end of the wiring substrate 97. As shown in sectional form in FIG. 23, the cassette of the above construction is mounted to the body. A magnetic circuit of the device is so adjusted as to make equal bias magnetic fields 23a and 94a when the cassette is mounted as above.

Under this condition, a connector 100 secured to the tip of a moving member 99 provided for the body 90 is connected electrically and mechanically to the external connection terminals 97a of the wiring substrate 97 provided for the cassette. When reading or writing the memory, a driving unit 80 shown in FIG. 21 is actuated by an external operation. Consequently, the moving member 99 is moved together with the wiring substrate 97 to a position shown in FIG. 24, and a rotating magnetic field is applied to the bubble memory chip 21. Essential parts in FIGS. 23 and 24 are illustrated, in plan view form, in FIGS. 25 and 26.

Figure 24:
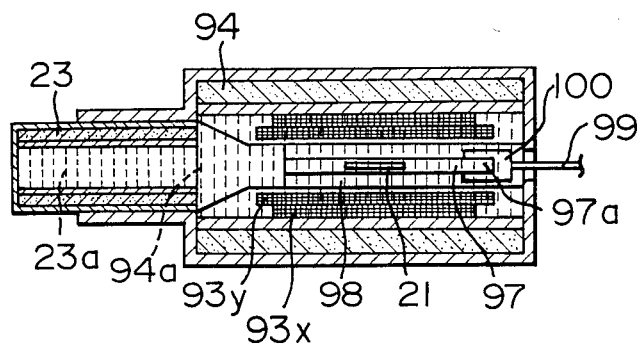
FIG. 24 is a sectional view useful in explaining the device of the fourth embodiment with the cassette mounted.
Figure 25:
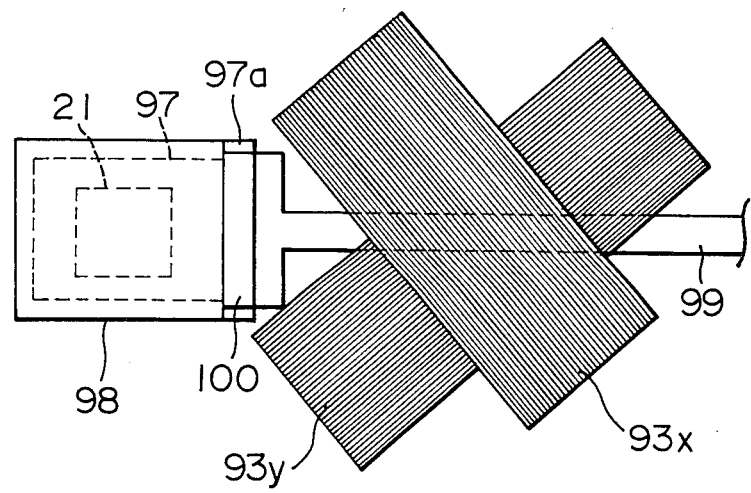
FIG. 25 is a fragmentary plan view of the device shown in FIG. 23.
Figure 26:
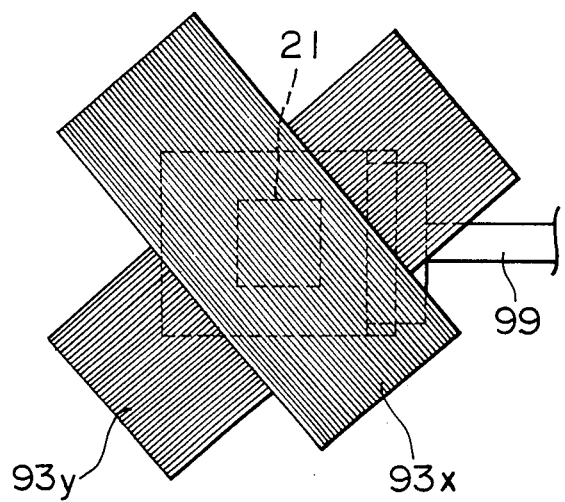
FIG. 26 is a fragmentary plan view of the device shown in FIG. 24.

To dismount the cassette placed in the condition shown in FIG. 24, the driving unit 80 is first released by an operation button (not shown) to return to moving member 99 to the position in FIG. 23 where the wiring substrate 97 is received in the cassette. Thereafter, the cassette is taken out of the cassette inserting portion 92. Upon removal of the cassette from the cassette inserting portion 92, a mechanical coupling force between the external connection terminals 97a and the connector 100 must be overcome. To this end, it is effective to draw out the cassette by clamping the mold portion 98 externally of the cassette. More specifically, at portions having a minimal effect on the bias field 23a applied to the bubble memory chip 21, for example, at lefthand portions 25a shown in FIG. 23, a pair of clamping pressure responsive buttons are provided which are normally urged outwards to project beyond the cassette, and the upper and lower magnet plates 24 and the upper and lower magnetic shunt plates 23 are partially cut away in register with the paired buttons, whereby the cassette is drawn out while clamping the mold portion 98 by depressing the buttons. Various methods may otherwise be conceivable, including improving the connector 100, but the manner to draw out the cassette is outside the theme of the present invention and will not be described in more detail.

As has been described in greater detail, according to the present invention, the rotating field generator can be eliminated from the magnetic bubble memory cassette to advantageously reduce the thickness, size and cost of the cassette. In addition, the memory of the device has a function comparable to that of other types of storage medium such as a magnetic disc and a magnetic tape. The present invention will therefore contribute greatly to the widespread use of the magnetic bubing ble memory and will be highly evaluated in industrial fields.

We claim:
1. A magnetic bubble memory device comprising:
a cassette including a bubble memory chip, a set of upper and lower magnets disposed above and below said bubble memory chip, respectively, for generating a bias magnetic field to sustain magnetic bubbles in said bubble memory chip, a magnetic shield case having a set of upper and lower plates disposed above said upper magnetic and below said lower magnet, respectively, and coupled to one another, a first conductive shield case for enclosing said upper magnet and said upper plate, a second conductive shield case for enclosing said lower magnet and said lower plate, and external connection terminals provided on at least one of side surfaces of said cassette; and
a body of the magnetic bubble memory device including a core in the form of a picture frame larger than said cassette, a pair of coils wound on said core for generating a rotating magnetic field to propagate the magnetic bubbles in said bubble memory chip, a third conductive shield case for enclosing said core, said pair of coils and said cassette adapted to be mounted in a central space of said core, said third conductive shield case being divided into upper and lower portions, and connector means arranged for connection with said external connection terminals of said cassette;

wherein when said cassette is mounted in the central space of said core, said first and second conductive shield cases of said cassette are coupled to said upper and lower portions of said third conductive shield case of said body, respectively, so that said bubble memory chip, said core and said pair of coils are placed in a single space delimited by said first, second and third conductive shield cases.

2. A magnetic bubble memory device according to claim 1, wherein said upper and lower plates of said magnetic shield case are coupled to one another by posts disposed at the corners of said upper and lower plates.

3. A magnetic bubble memory device according to claim 1, wherein respective portions of said first and second conductive shield cases of said cassette opposite to said bubble memory chip are parallel to upper and lower surfaces of said chip.

4. A magnetic bubble memory device according to claim 1, wherein a pair of said external connection terminals of said cassette are provided on opposite side surfaces of said cassette, respectively, and said body includes a pair of said connector means corresponding to said pair of external connection terminals.

5. A magnetic bubble memory device according to claim 1, wherein said cassette is mounted in or dismounted from the center of said core by elevator means provided for said body.

6. A magnetic bubble memory device according to claim 5, wherein a pair of said external connection terminals of said cassette are provided on opposite side surfaces of said cassette, respectively, and said body includes a pair of said connector means corresponding to said pair of external connection terminals.

7. A magnetic bubble memory device according to claim 6, wherein said pair of connector means engage or disengage said pair of external connection terminals in cooperation with ascent or descent of said elevator means.

8. A magnetic bubble memory device comprising:
a cassette including a bubble memory chip, a set of upper and lower magnets disposed above and below said bubble memory chip, respectively, for generating a bias magnetic field to sustain magnetic bubbles in said bubble memory chip, a magnetic shield case having a set of upper and lower plates disposed above said upper magnet and below said lower magnet, respectively, and coupled to one another, a first conductive shield case for enclosing said upper magnet and said upper plate, a second conductive shield cas for enclosing said lower magnetic and said lower plate, and external connection terminals provided on a lower surface of said cassette; and
a body of the magnetic bubble memory device including a core in the form of a picture frame larger than said cassette, a pair of coils wound on said core for generating a rotating magnetic field to propagate the magnetic bubbles in said bubble memory chip, a third conductive shield case for enclosing said core, said pair of coils and said cassette adapted to be mounted in a central space of said core, said third conductive shield case being divided into an upper pivotally mounted portion and a lower fixed portion, and connector means arranged for connection with said external connection terminals of said cassette;

wherein when said cassette is mounted in the central space of said core, said first and second conductive shield cases of said cassette are coupled to said upper and lower portions of said third conductive shield case of said body, respectively, so that said bubble memory chip, said core and said pair of coils are placed in a single space delimited by said first, second and third conductive shield cases.

9. A magnetic bubble memory device according to claim 8, wherein said upper and lower plates of said magnetic shield case are coupled to one another by posts disposed at the corners of said upper and lower plates.

10. A magnetic bubble memory device comprising:
a cassette including a bubble memory chip, a set of upper and lower magnets disposed above and below said bubble memory chip, respectively, for generating a bias magnetic field to sustain magnetic bubbles in said bubble memory chip, a magnetic shield case having a set of upper and lower plates disposed above said upper magnet and below said lower magnet, respectively, and coupled to one another, a first conductive shield case for enclosing said upper magnet and said upper plate, a second conductive shield case for enclosing said lower magnetic and said lower plate, and external connection terminals provided on at least one of side surfaces of said cassette; and
a body of the magnetic bubble memory device including a pair of rectangular solenoids for enclosing said cassette and for applying a rotating magnetic field to said bubble memory chip in said cassette to propagate the magnetic bubbles in said bubble memory chip, a moving member for introducing said cassette into said rectangular solenoids, and connector means arranged for connection with said external connection terminals of said cassette;
wherein when said cassette is inserted into said rectangular solenoids by said moving member, said external connection terminals of said cassette are connected to said connector means of said body.

11. A magnetic bubble memory device according to claim 10, wherein said upper and lower plates of said magnetic shield case are coupled to one another by posts disposed at the corners of said upper and lower plates.

12. A magnetic bubble memory device according to claim 10, wherein said connector means are connected to said external connection terminals of said cassette when insertion of said cassette is detected.

13. A magnetic bubble memory device comprising:
a cassette including a first bias magnetic field generating means having a set of upper and lower magnets for applying a first bias magnetic field, a magnetic shield case for enclosing said set of magnets, said magnetic shield case having one open side face, a bubble memory chip separable from said cassette through the open side face of said magnetic shield case, and external connection terminals extending from said bubble memory chip; and
a body of the magnetic bubble memory device including a rotating magnetic field generating means for enclosing said bubble memory chip separated from said cassette and for generating a rotating magnetic field to propagate magnetic bubbles within said bubble memory chip, a second bias magnetic field generating means for applying a second bias magnetic field to said bubble memory chip, a moving member for introducing said bubble memory chip into said rotating magnetic field generating means, and connector means mounted at an end of said moving member and arranged for connection with said external connection terminals extending from said bubble memory chip.

14. A magnetic bubble memory device according to claim 13, wherein said bubble memory chip is carried by a wiring substrate which is moved by said moving member.

15. A magnetic bubble memory device according to claim 14, wherein said external connection terminals are provided on an end of said wiring substrate.

* * * * *